(12) United States Patent
Li et al.

(10) Patent No.: US 8,235,738 B2
(45) Date of Patent: Aug. 7, 2012

(54) CARD EDGE CONNECTOR WITH AN IMPROVED RETAINER

(75) Inventors: Zhuang-Xing Li, Kunshan (CN); Ze-Lin Yao, Kunshan (CN); Wen-Jun Tang, Kunshan (CN)

(73) Assignee: Hon Hai Precision Ind. Co., Ltd., New Taipei (TW)

( * ) Notice: Subject to any disclaimer, the term of this patent is extended or adjusted under 35 U.S.C. 154(b) by 177 days.

(21) Appl. No.: 12/842,051

(22) Filed: Jul. 23, 2010

(65) Prior Publication Data
US 2011/0021053 A1    Jan. 27, 2011

(51) Int. Cl.
*H01R 13/62* (2006.01)
(52) U.S. Cl. .................. 439/327; 439/347
(58) Field of Classification Search ........... 439/59, 439/153, 155, 157, 160, 327, 328, 347
See application file for complete search history.

(56) References Cited

U.S. PATENT DOCUMENTS

| 4,975,073 | A | * | 12/1990 | Weisman | 439/157 |
| 5,676,561 | A | * | 10/1997 | Chiang | 439/328 |
| 5,766,031 | A | * | 6/1998 | Yeh | 439/328 |
| 6,368,124 | B1 | | 4/2002 | Wang | |
| 7,083,448 | B2 | * | 8/2006 | Tanigawa | 439/160 |
| 7,645,150 | B1 | * | 1/2010 | Chang | 439/157 |

* cited by examiner

*Primary Examiner* — Thanh Tam Le
(74) *Attorney, Agent, or Firm* — Wei Te Chung; Andrew C. Cheng; Ming Chieh Chang (57) ABSTRACT

A card edge connector for mating with an electronic card includes an elongated housing (1), a number of contacts retained to the housing (1), and a retainer (2) at one end of the housing (1). The housing (1) has a pair of opposed side walls (11), a central slot (12) between the side walls and a fitting section at one end thereof. The fitting section defines a pair of axes holes (145). The retainer (2) has a base portion (21) with a pair of pivots (211) engaging with the axes holes (145), a latch projection (22) inwardly extending from the base portion for locking the electronic card, a flexible arm (23) unitarily extending from the base portion (21) to resist an inner wall of the fitting section for fastening the retainer (2) to the housing (1).

10 Claims, 11 Drawing Sheets

CARD EDGE CONNECTOR WITH AN IMPROVED RETAINER

BACKGROUND OF THE INVENTION

1. Field of the Invention

The present invention relates to card edge connectors, more particularly to card edge connectors with an improved retainer.

2. Description of Related Art

Card edge connectors are employed widely in computers to receive a memory card, graphic card, network interface card et al. The card edge connectors usually have an elongated housing, a plurality of contacts retained in the housing for electrically connecting a corresponding mating card, and at least a retainer at one end thereof for locking the mating card. The housing has a pair of side walls and a central slot between the side walls for receiving the mating card. The retainer is integrally extending outwardly from one end of the housing along a length direction. The retainer has a retention arm extending along the length direction of the housing, and a projection extending inwardly from the operating portion along a width direction for locking the mating card. The retention arm can move along a width direction for locking or withdrawing the mating card.

The housing further has a rigid stop arm extending along the length direction and located at an outside of the retention arm. The stop arm and retention arm defines a gap therebetween for allowing the deflection of the retention arm, and the stop arm serves to limit the deflection of said retention arm. Besides, the retention arm and the stop arm diverge with respect to each other whereby the is increased in the width direction for supplying a deflection space to the retention arm.

However, the retention arm and the stop arm extend along the length direction of the housing, which make all retention arm and stop arm be flexible, then the stop arm also can deflect outwardly along the width direction. Therefore, the stop arm can not effectively limit the deflection of the retention arm, and the retention arm is easily broke off when the retention arm is further deformed via a deflection of the stop arm.

Hence, an improved card edge connector is desired to overcome the above problems.

BRIEF SUMMARY OF THE INVENTION

According to one aspect of the present invention, a card edge connector for mating with an electronic card, comprises: an elongated housing having a pair of opposed side walls, a central slot between the side walls and a fitting section at one end thereof, the fitting section defining a pair of axes holes; a plurality of contacts retained to the housing; and a retainer rotatably retained in the fitting section, the retainer having a base portion with a pair of pivots engaging with the axes holes, a latch projection inwardly extending from the base portion for locking the electronic card, a flexible arm unitarily extending from the base portion to resist an inner wall of the fitting section for fastening the retainer to the housing.

According to another aspect of the present invention, a card edge connector for mating with an electronic card, comprises: an elongated housing having a pair of opposed side walls and a central slot extending along a length direction between the side walls for receiving the electronic card; a plurality of contacts retained to the housing; and a retainer at one end of the housing, the retainer having a latch projection extending inwardly along a width direction of the housing for locking the electronic card, an operating arm extending out of the housing and a stop block projecting toward the operating arm to limit a deflection of the operating arm; wherein the operating arm and the stop block define a gap therebetween, and the gap becomes narrow gradually from an initial position to a free end thereof.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE PREFERRED EMBODIMENTS

In the following description, numerous specific details are set forth to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like have been omitted inasmuch as such details are not necessary to obtain a complete understanding of the present invention and are within the skills of persons of ordinary skill in the relevant art.

Reference will be made to the drawing figures to describe the present invention in detail, wherein depicted elements are not necessarily shown to scale and wherein like or similar elements are designated by same or similar reference numeral through the several views and same or similar terminology.

Referring to FIGS. 1-5 and 11, a card edge connector 100 for mating with an electronic card 3 according to a first embodiment of the present invention is disclosed. The card edge connector 100 comprises an elongated housing 1, a plurality of contacts (not shown) retained in the housing 1 and a retainer 2 attached to one side of the housing 1. The electronic card 3 has a first projection 31 and a second projection 32 extending from upper and lower sides thereof along a length direction thereof. The first projection 31 is longer and higher than the second projection 32. The first projection 31 and the second projection 32 define a notch 33 therebetween.

The housing 1 having a pair of elongated side walls 11, a central slot 12 between the side walls 11 and a fitting section 13 at one end of the housing 1. The central slot 12 extends along a length direction of the housing 1 for receiving a lower edge of the electronic card 3. The fitting section 13 has a first wall 131 and a second wall 132 aligned with side walls 11 respectively along the length direction. The second wall 132 is higher than the first wall 131, and the first wall 131 and the second wall 132 defines a receiving space 133 therebetween to receive the second projection 32 of the electronic card 3. The receiving space 133 is aligned with the central slot 12 along the length direction, while the receiving space 133 does not communicate with the central slot 12.

Figure 3:
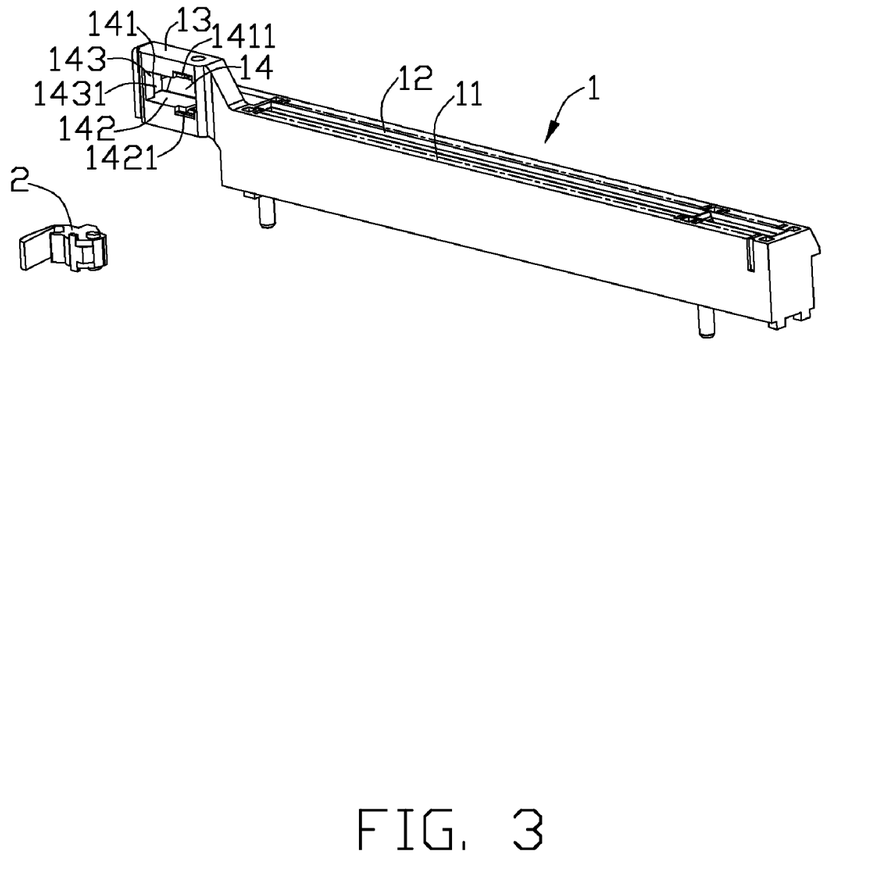
FIG. 3 is a partly exploded view of the card edge connector shown in FIG. 1.
Figure 4:
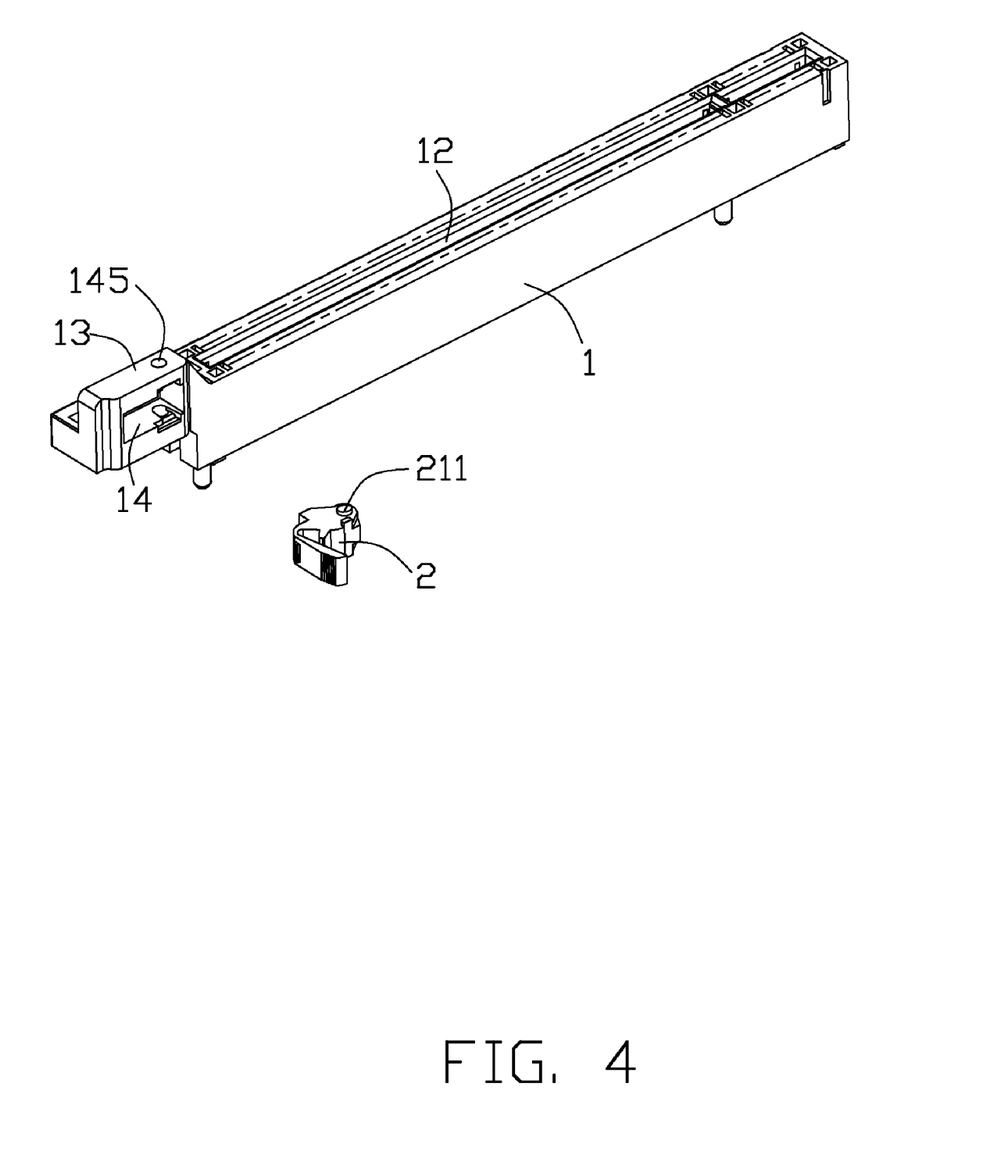
FIG. 4 is a view similar to FIG. 3, while taken from a different aspect.

The second wall 132 defines a cavity 14 extending therethrough along a width direction perpendicular to the length direction of the housing 1 to make the second wall 132 be divided to a top wall 141, a bottom wall 142, a left wall 143 and a right wall 144. The cavity 14 is formed between the top wall 141, bottom wall 142, left and right walls 143, 144. The right wall 144 directly connects with the side wall 11. The left wall 143 is located at outside of the right wall 144 along the length direction of the housing 1. The top and bottom walls 141, 142 define a pair of axes holes 145 extending therethrough along an up to down direction of the housing 1. The axes holes 145 have a same central axis along an upper to down direction. The top and bottom walls 141, 142 each defines a limiting slot 1411, 1421 recessed from outside thereof. The limiting slots 1411, 1421 extend along the length direction. The axes holes 145 and the limit slots 1411, 1421 are close to the right wall 144, and the axes holes 145 are located behind the limit slots 1411, 1421 along the width direction. The left wall 143 defines a locking slot 1431 at an inner side thereof along the width direction.

Figure 5:
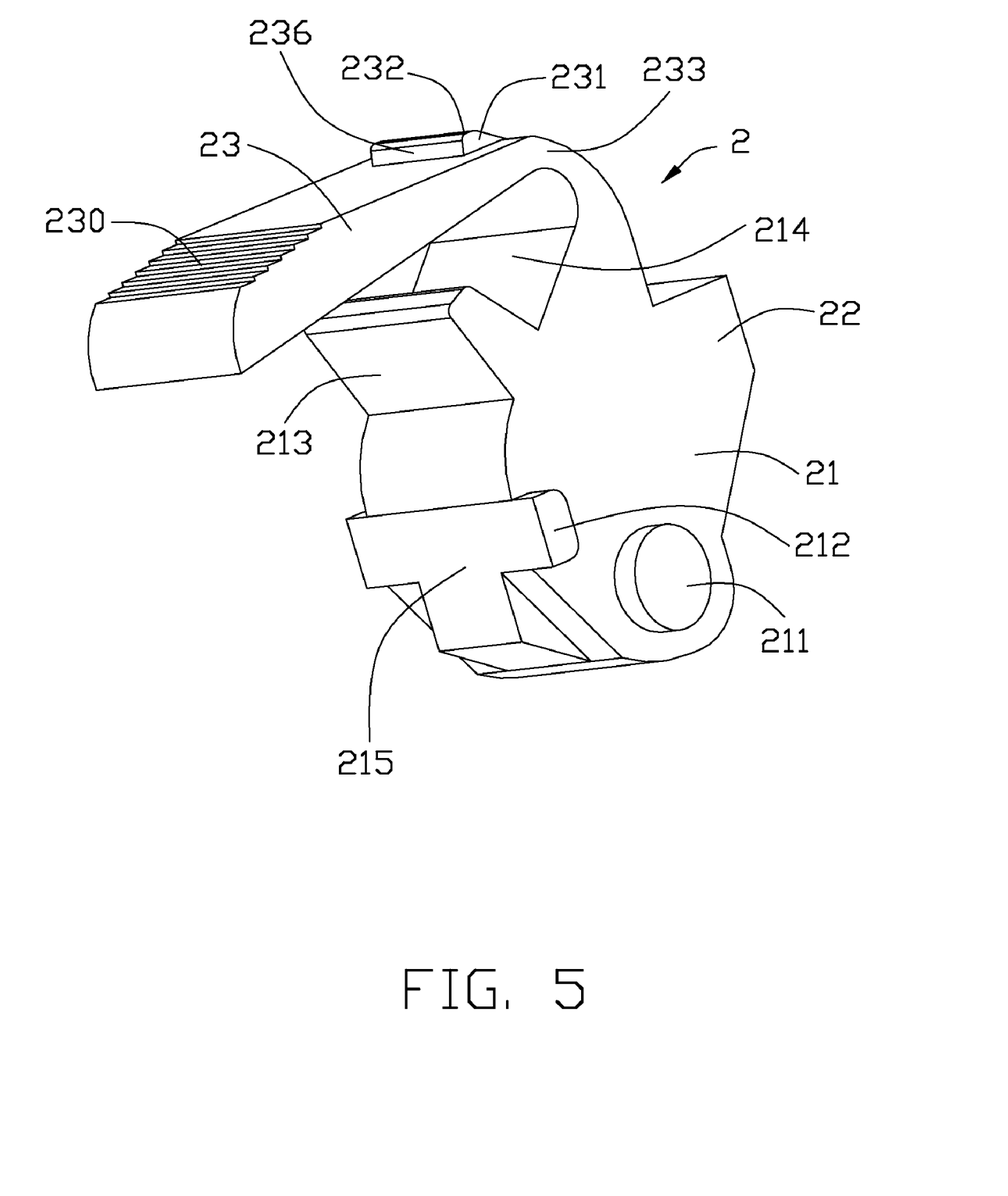
FIG. 5 is a perspective view of a retainer of the card edge connector shown in the FIG. 1.

The retainer 2 is retained on the fitting section 13, and the retainer 2 has a base portion 21 retained in the cavity 14, a latch projection 22 inwardly extending beyond the second wall 132 from the base portion 21 along the width direction, an operating arm 23 unitarily bending along an anticlockwise direction from the base portion 21, and a stop block 213 projecting outwardly from the base portion 21. The base portion 21 approximately presents as a cylinder. The latch projection 22, the operating arm 23 and the stop block 213 directly extend outwardly from an outer surface of the base portion 21, and are arranged one by one along the anticlockwise direction. The latch projection 22 and the stop block 213 are not flexible.

The base portion 21 is formed with a pair of pivots 211 at upper and lower sides thereof to engage with the axes holes 145, a pair of protrusions 212 respectively extending upwardly and downwardly to engage with the limiting slots 1411, 1421, and a limiting surface 215 between the protrusions 212 to resist an inner side of the right wall 144 for preventing the retainer 2 from overly rotating along the anticlockwise direction. The latch projection 22, operating arm 23 and the stop block 213 are located at one side of the pivots 211 along the length direction.

The latch projection 22 inwardly extends into the receiving space 133 to lock with the notch 33 of the electronic card 3. The operating arm 23 and base portion 21 defines a space therebetween to make the operating arm 23 be flexible. The operating arm 23 has a bending portion 233 connecting with the base portion 21 and an operating portion 230 outwardly extending beyond the second wall 132. The bending portion 233 extends along the anticlockwise direction and has a position block 231 protruding outwardly to fasten with the locking slot 1431. The position block 231 has an inclined face 232 at an inner side thereof to guide the position block 231 moving into the locking slot 1431, and a stopping face 236 at outside thereof to resist an inner side of the locking slot 1431 and prevent the position block 231 from moving out of the locking slot along the width direction. The stop block 213 extends toward the operating portion 230. The operating portion 230 and the stop block 213 define a gap 214 therebetween. The gap 214 becomes narrow gradually from an initial position to a free end of the operating portion 230 and the stop block 213. Besides, the stop block 213 is not flexible, then the operating portion 230 can be effectively stopped by the stop block 213 and can not further be deformed. Thereby the operating arm 23 can not be overly deformed and is not easily broke off.

Figure 1:
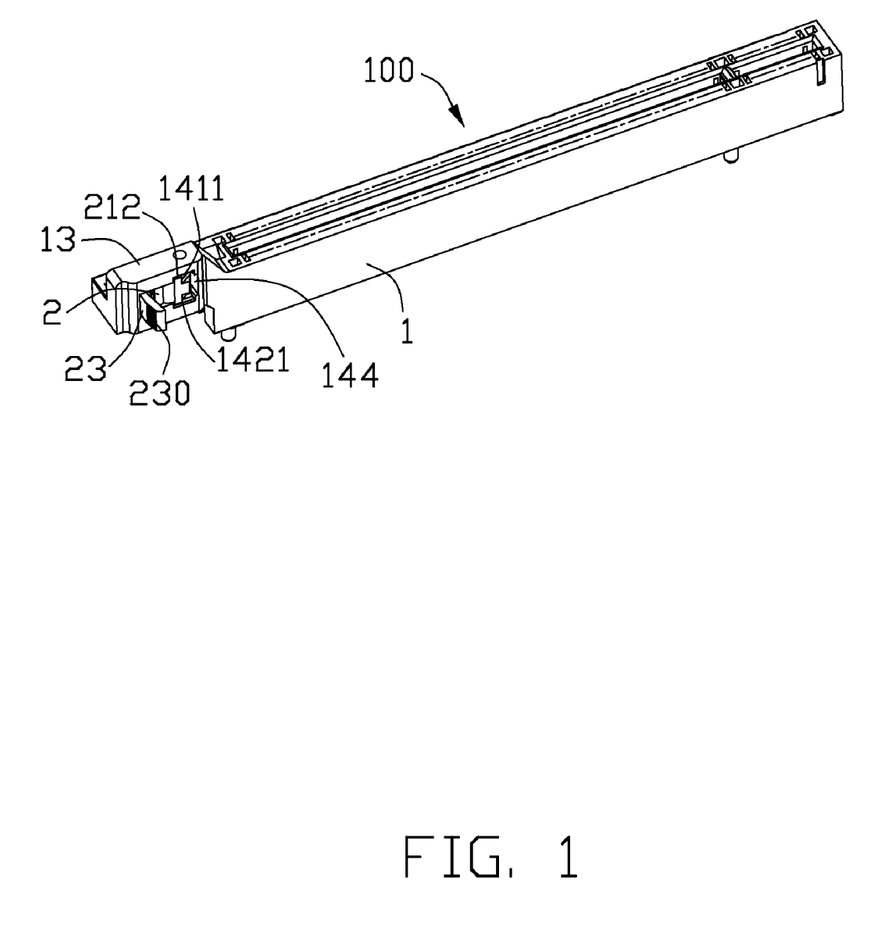
FIG. 1 is a perspective view of a card edge connector according to a first embodiment of the present invention.
Figure 2:
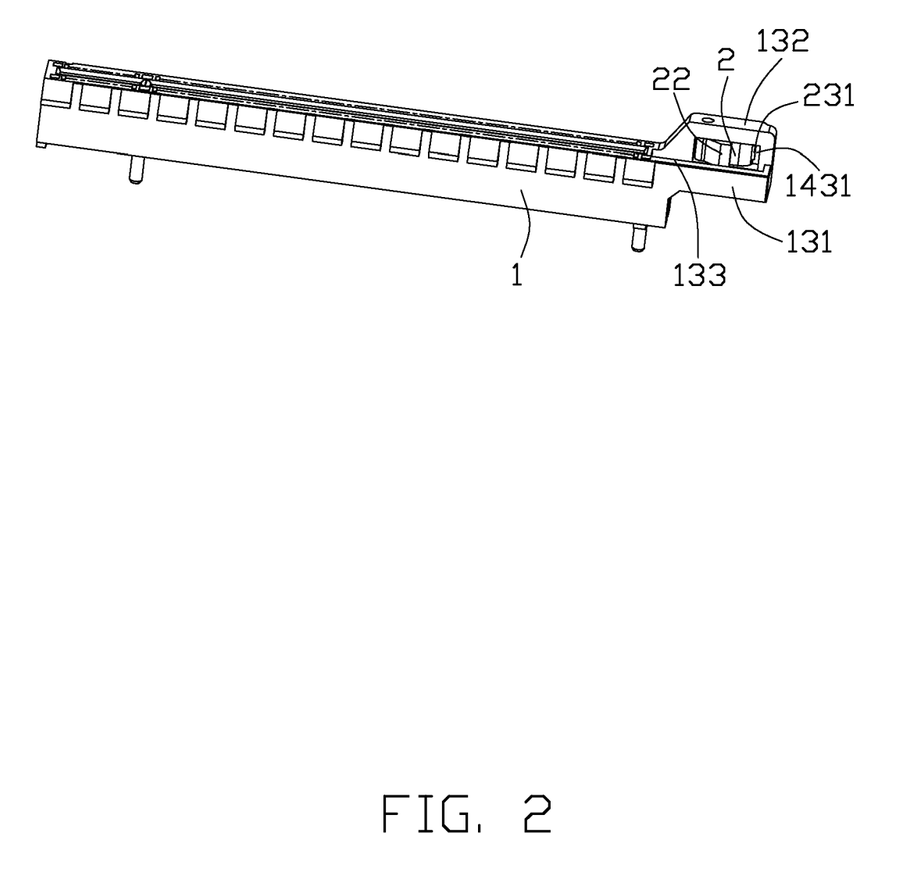
FIG. 2 is a view similar to FIG. 1, while taken from a different aspect.

In assembling process of the card edge connector 100 of the present invention, firstly, assembling the contacts to the housing 1 along an up to down direction of the housing 1, then the contacts protrude into the central slot 12 to electrically connect with the electronic card 3; secondly, assembling the retainer 2 to the cavity 13 from one side of the fitting section 13, then the base 21 are received in the cavity 13; the pivots 211 are received in the axes holes 145 and can rotate in the axes holes 145; the latch projection 22 inwardly extending beyond the second wall 132 and received into the receiving space 133; the protrusions 212 are received in the limiting slots 1411, 1421 and can move in the limiting slots 1411, 1421; the operating arm 23 resists the left wall 143 and outwardly extends out of the cavity 13, then the retainer 2 is retained to the housing 1 via the pivots 211 engaging with the axes holes 145 and the operating arm 23 resisting the left wall 143.

Figure 11:
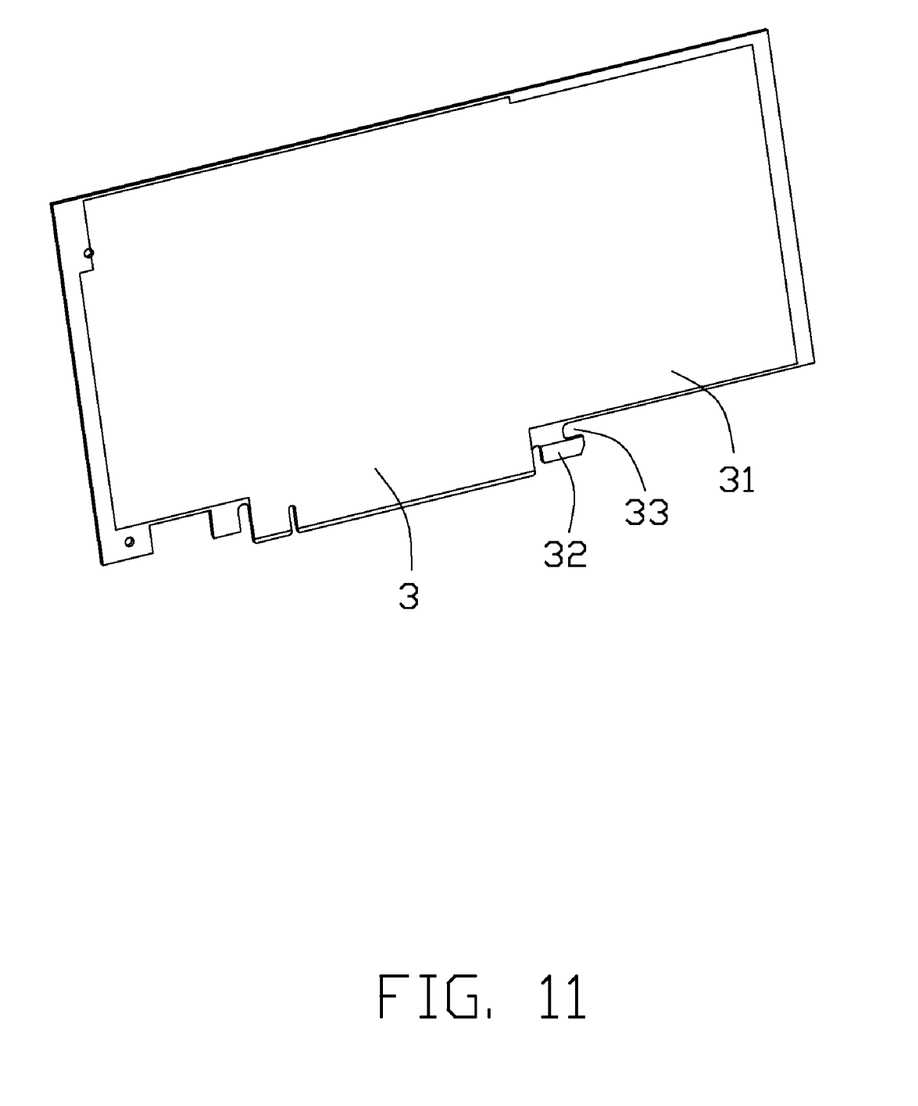
FIG. 11 is a perspective view of an electronic card for mating with the card edge connector shown in FIG. 1 or FIG. 6.

In an inserting process of the electronic card 3, firstly, pushing the operating arm 23 along the anticlockwise direction to make the latch projection 22 move out of the receiving space 133; secondly, inserting the electronic card 3 into the central slot 12, then the lower edge of the electronic card 3 is received into the central slot 12 to electrically connect with the contacts, and the second projection 32 is received in the receiving space 133; thirdly, rotating the retainer 2 along a clockwise direction, the latch projection 22 moves into the receiving space 133 and latches with the notch 33 of the electronic card 3 to prevent the electronic card 3 from moving upwardly, then the position block 231 moves inwardly to lock with the locking slot 1431, the stopping face 236 of the position block 231 resist an inner side of the locking slot 1431 for positioning the retainer 2 to be in the locking status and preventing the operating arm 23 from moving outwardly along the width direction; and the protrusions 212 moves to a left end of the limiting slots 1411, 1421 and resist a left inner wall of the limiting slots 1411, 1421 to preventing the retainer 2 from further rotating along the clockwise direction.

In a withdrawing process of the electronic card 3, firstly, pushing the operating arm 23 along the length direction to drive the position block 231 move out of the locking slot 1431, then the stop block 213 resists one side of the operating arm 23 to make the operating arm 23 can not further be deformed, and preventing the operating arm 23 from being broke off via further pushing; secondly, rotating the retainer 2 along the anticlockwise direction, the latch projection 22 moves out of the notch 33 to release the electronic card 3, then the electronic card 3 can be pulled out of the central slot 12; at this time, the protrusions 212 move to a right end of the limit slots 1411, 142112 and resist a right inner wall of the limit slots 1411, 1421, and the limiting wall 215 resists the inner side of the right wall 144 to prevent the retainer 2 from being rotated overly along the anticlockwise direction.

Referring to FIGS. 6-11, a card edge connector 200 according to a second embodiment of the present invention is disclosed. The card edge connector 200 also comprises an elongated housing 4 and a retainer 5 retained at one side of the housing 4. The housing 4 in the second embodiment is approximately same to the housing 1 in the first embodiment, and also has a central slot 42 to receive the lower edge of the electronic card 3 and the second wall 43 to retain the retainer 5. The second wall 43 defines a cavity 44 extending therethrough along a width direction perpendicular to the length direction of the housing 4 to make the second wall 43 be divided to a top wall 441, a bottom wall 442, a left wall 443 and a right wall 444. The cavity 44 is formed between the top wall 441, bottom wall 442, left and right walls 443, 444. The left wall 443 is located at outside of the right wall 444 along the length direction of the housing 4. The top and bottom walls 441, 442 each defines a limit slot 4411, 4421 near the left wall 443, and an axes hole 445 at a middle position thereof. The right wall 444 defines a limit surface 4440 extending obliquely.

Figure 10:
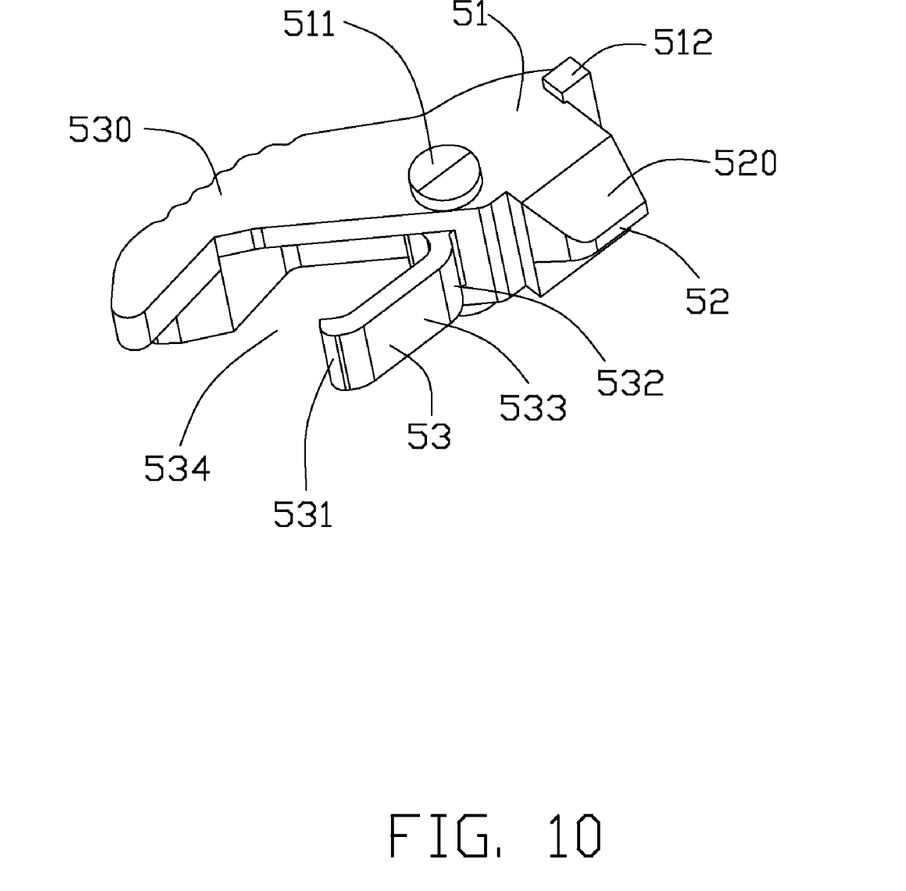
FIG. 10 is a perspective view of a retainer of the card edge connector shown in the FIG. 6.

The retainer 5 in the second embodiment is different from the retainer 2 in the first embodiment, and the retainer 5 has a base portion 51, a pair of limit protrusions 512 and an operating arm 530 at opposite two sides of the base portion 51, and a spring arm 53 unitarily bending from the base portion 51 and located at an inner side of the operating arm 530, and a latch projection 52 inwardly extending beyond the second wall 43. The base portion 51 is formed with a pair of pivots 511 at upper and lower sides thereof to engage with the axes holes 445. The latch projection 52 is formed with a guiding face 520 extending obliquely at an upper side thereof to guide the electronic card 3 being inserted into the central slot 42.

The spring arm 53 is spaced apart from the operating arm 530 along the width direction, and the spring arm 53 is flexible, while the operating arm 530 is not flexible. The spring arm 53 has an initial bending portion 532 bending inwardly between the pivots 511, a resisting portion 533 extending along the length direction from the initial bending portion 532, and a stop block 531 at a free end thereof. The stop block 531 extends toward the operating arm 530 to resist the operating arm 530 from being pushed overly. The stop block 531 and the operating arm 530 define a gap 534 therebetween. The gap 534 becomes narrow gradually from an initial position to a free end thereof to limit a deflection of the operating arm 530. The spring arm 53 and the operating arm 530 define an acute angle therebetween. The resisting portion 533 is flexible and resists the limit surface 4440, and the resisting portion 533 is located between the operating arm 530 and the housing 4, thereby the operating arm 530 can move along an anticlockwise direction around the pivots 511.

Figure 6:
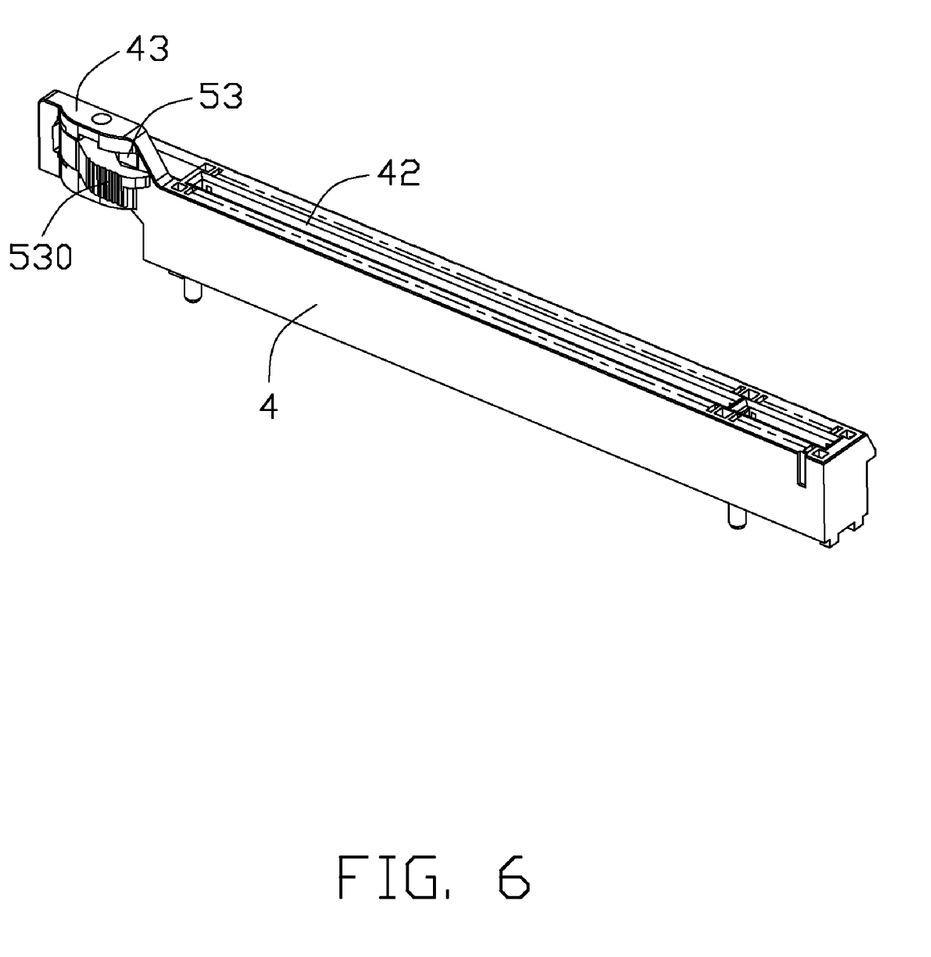
FIG. 6 is a perspective view of a card edge connector according to a second embodiment of the present invention.
Figure 7:
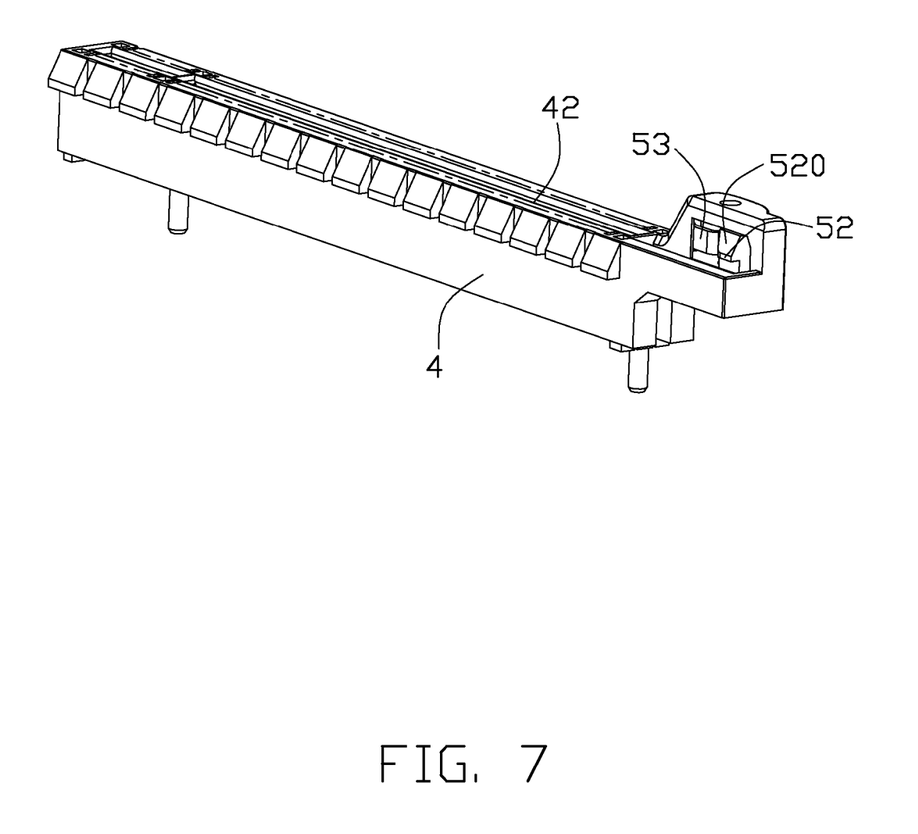
FIG. 7 is a view similar to FIG. 6, while taken from a different aspect.
Figure 8:
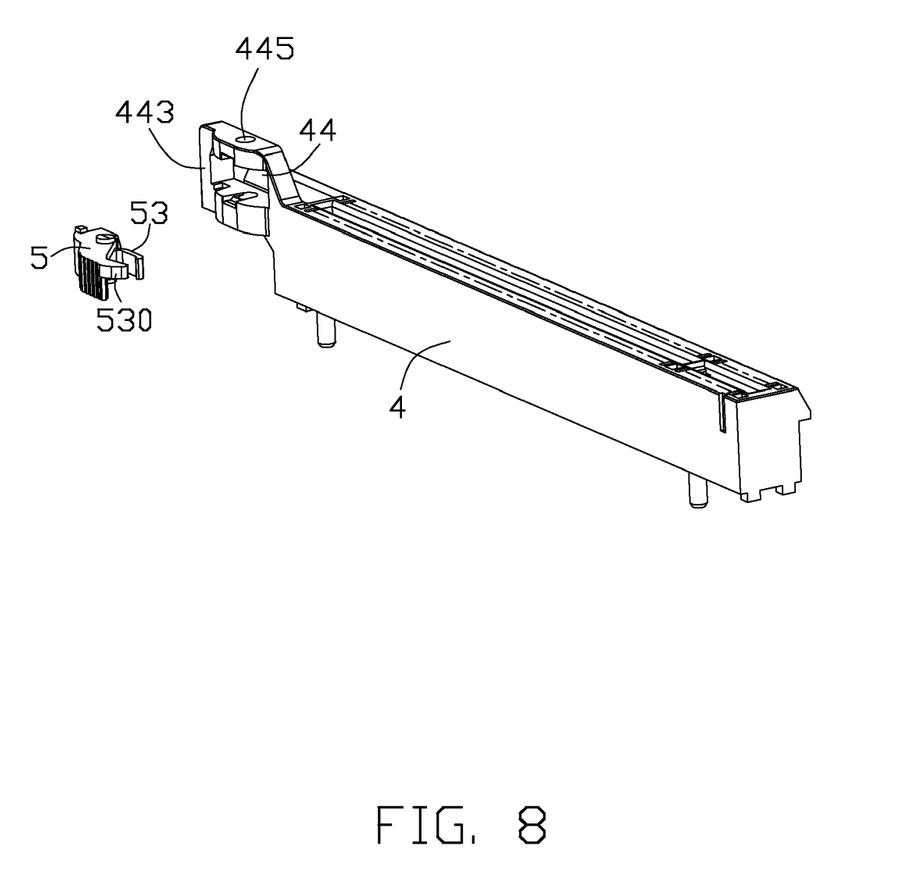
FIG. 8 is a partly exploded view of the card edge connector shown in FIG. 6.
Figure 9:
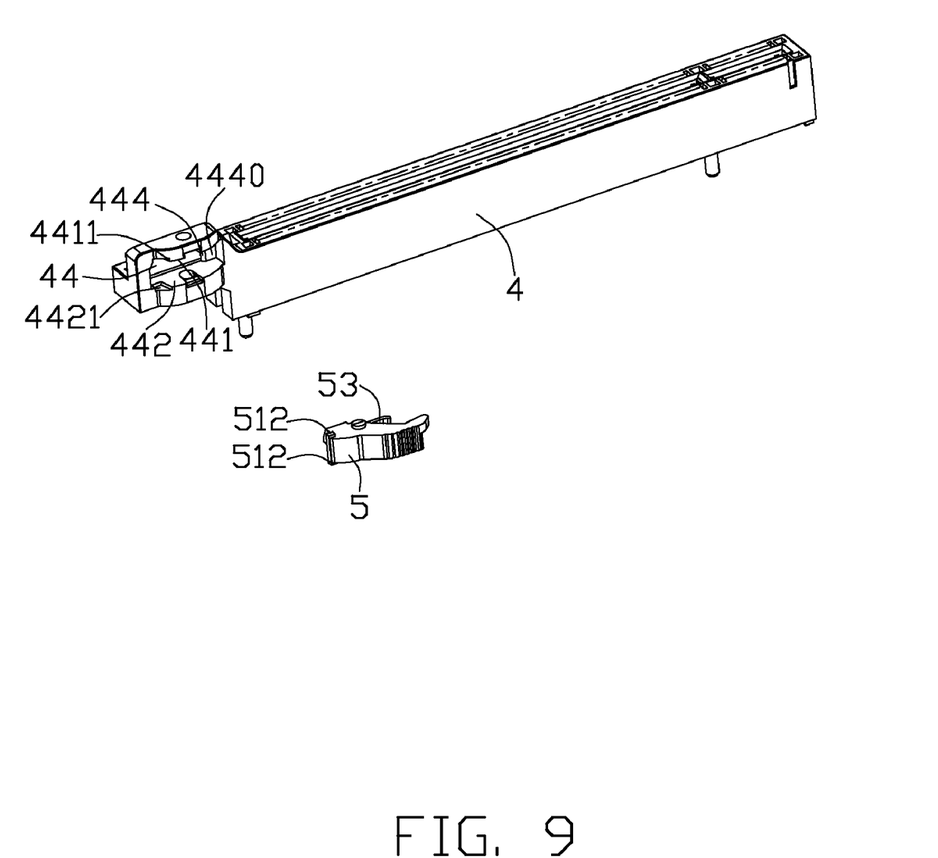
FIG. 9 is a view similar to FIG. 8, while taken from a different aspect

In an inserting process of the electronic card 3 to the card edge connector 200, firstly, inserting the electronic card 3 downwardly into the central slot 42, the second projection 32 moves downwardly along the guiding face 520 and resists the latch projection 52 outwardly, then the whole retainer 5 rotates along the anticlockwise direction pivot on the pivots 511, and the spring arm 53 resists the limit surface 4440 and is deformed outwardly relative to the operating arm 530, and a distance between the operating arm 530 and the spring arm 53 is compressed; when the electronic card 3 is inserted into the central slot 42, the second projection 32 moves below the latch projection 52, then the spring arm 53 rebounds to make the whole retainer 5 move along the clockwise direction, and the latch projection 52 locks with the notch 33 to prevent the electronic card 3 from moving upwardly; at this time, the limit protrusion 512 is received into the limit slots 4411, 4412 and resists an inner wall of the limit slots 4411, 4412 to prevent the retainer 5 from overly rotating.

In a withdrawing process of the electronic card 3, firstly, pressing the operating arm 530 inwardly pivot on the pivots 511, then the latch projection 52 outwardly moves out of the notch 33; at this time, the electronic card 3 can be pulled out of the central slot 42. In above withdrawing process, the resisting portion 533 resists the limit surface 4440, and the stop block 531 resists an inner side of the operating arm 530 when the latch projection 52 moves out of the notch 33, which can prevent the operating arm 530 from further moving along the anticlockwise direction, then the operating arm 530 is not easily broke off and can not be pressed overly.

As fully described above, both stop blocks 213, 53 in the first and second embodiments of the present invention can limit the operating arm 530 from moving overly, then the operating arm 530 can be protected from being broke off. Besides, the retainer 2, 5 in the first and second embodiment each is unitarily formed with a flexible arm 23, 53, and the retainer 2, 5 in the first and second embodiments only relies on the flexible arm 23, 53 resisting inner side wall of the housing 1, 4, and pivots 211, 511 engaging with the axes holes 145, 445 to be retained to the housing 1, 4, which make the card edge connector 100, 200 has a simple structure and is assembled conveniently; In addition, the retainer 2, 5 relies on a deformation of the flexible arm 23, 53 to rotate along the clockwise or anticlockwise direction; and the stop block 53 can limit deflection of the operating arm 530 and indirectly limit deformation of the spring arm 53, which can assure a stable structure of the retainer 5.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

We claim:

1. A card edge connector for mating with an electronic card, comprising:
   an elongated housing having a pair of opposed side walls, a central slot between the side walls and a fitting section at one end thereof, the fitting section defining a pair of axes holes;
   a plurality of contacts retained to the housing; and
   a retainer rotatably retained in the fitting section, the retainer having a base portion with a pair of pivots engaging with the axes holes, a latch projection inwardly extending from the base portion for locking the electronic card, a flexible arm unitarily extending from the base portion to resist an inner wall of the fitting section for fastening the retainer to the housing;
   wherein the retainer is formed with an operating portion extending out of the housing, and the operating portion can be pushed to drive flexible arm deformed for rotating the retainer along an anticlockwise or clockwise direction;
   wherein the flexible arm bends outwardly from an inner side of the base portion, and the flexible arm and the base portion defines a space therebetween to make the flexible arm can be deformed along the length direction, the operating portion is formed at a free end of the flexible arm;

wherein the fitting section defines a locking slot at the inner wall thereof, the flexible arm is formed with a position block projection outwardly to lock with the locking slot when the electronic card is inserted into the central slot; and wherein the position block has an inclined face at an inner side thereof to guide the position block moving into the locking slot and a stopping face at an outer side thereof to resist an inner wall of the locking slot for preventing the operating portion from moving outwardly along the width direction when the electronic card is inserted into the central slot.

2. The card edge connector as claimed in claim 1, wherein the fitting section defines a pair of limiting slots recessed from upper and lower outer sides thereof, and the base portion is formed with a pair of protrusions extending upwardly and downwardly respectively to engage with the limiting slots for preventing the retainer from rotating overly along the anticlockwise or clockwise direction.

3. The card edge connector as claimed in claim 2, wherein the limiting slots extends along the length direction, the protrusions resist a left inner wall of the limiting slots to prevent the retainer from overly rotating along the clockwise direction, and resist a right inner wall to prevent the retainer from overly rotating along the anticlockwise direction.

4. The card edge connector as claimed in claim 1, wherein the retainer is formed with a stop block extend toward the flexible arm from the base portion to prevent the flexible arm from being overly deformed, the latch projection, flexible arm and the stop block are located at one side of the pivots along the length direction.

5. The card edge connector as claimed in claim 1, wherein the operating portion is located at outsides of the flexible arm, and the operating portion and the flexible arm defines a space therebetween to make the flexible arm be deformed along a width direction of the housing.

6. The card edge connector as claimed in claim 5, wherein the fitting section defines a pair of limit slots, the retainer has a pair of limit protrusions to engage with the limit slots for preventing the retainer from overly rotating along an anticlockwise direction, and the limit protrusions and the flexible arm are formed at opposite two ends of the retainer.

7. A card edge connector for mating with an electronic card, comprising:
an elongated housing having a pair of opposed side walls and a central slot extending along a length direction between the side walls for receiving the electronic card;
a plurality of contacts retained to the housing; and
a retainer at one end of the housing, the retainer having a latch projection extending inwardly along a width direction of the housing for locking the electronic card, an operating arm extending out of the housing and a stop block projecting toward the operating arm to limit a deflection of the operating arm;
wherein the operating arm and the stop block define a gap therebetween, and the gap becomes narrow gradually from an initial position to a free end thereof;
wherein the retainer has a base portion rotatably retained on the housing, the latch projection and the stop block directly projects outwardly from an outer surface of the base portion and are not flexible; and
wherein the operating arm projects outwardly and bends along an anticlockwise direction from the base portion, the operating arm is flexible and has a bending portion connecting the base portion and an operating portion at outside of the stop block, and the operating portion resists a free end of the stop block to prevent the operating portion from deflecting overly when the operating arm is pushed along the anticlockwise direction.

8. The card edge connector as claimed in claim 7, wherein the housing is formed with a second wall connecting with one side wall along the length direction, the second wall defines a cavity which divides the second wall to a top wall, a bottom wall, a left wall and a right wall around the cavity, the base portion is retained in the cavity, the latch projection inwardly extends beyond the second wall, and the operating arm outwardly extends beyond the second wall, the top and bottom walls each defines an axes hole near the right wall, and the base portion is formed with a pair of pivots at upper and lower sides thereof to engage with the axes holes, the latch projection, operating arm and stop block are located at one side of the pivot along the length direction, the operating arm resists the left wall.

9. The card edge connector as claimed in claim 8, wherein the right wall connects with the side wall directly, and the left wall is located at outside of the right wall, the left wall defines a locking slot at an inner side thereof along a width direction of the housing, and the bending portion is formed with a position block projecting outwardly to lock with the locking slot for positioning the retainer when the electronic card is inserted in the central slot.

10. The card edge connector as claimed in claim 9, wherein the top and bottom wall each defines a limiting slot near the right wall, and the base portion is formed with a pair of protrusions extending upwardly and downwardly respectively to engage with the limiting slots for preventing the retainer from rotating overly along the anticlockwise or clockwise direction.

* * * * *